(12) United States Patent
Bellaouar et al.

(10) Patent No.: US 7,345,550 B2
(45) Date of Patent: Mar. 18, 2008

(54) TYPE II PHASE LOCKED LOOP USING DUAL PATH AND DUAL VARACTORS TO REDUCE LOOP FILTER COMPONENTS

(75) Inventors: Abdellatif Bellaouar, Richardson, TX (US); Ahmed R. Fridi, Richardson, TX (US); Arul M. Balasubramaniyan, Plano, TX (US)

(73) Assignee: Sirific Wireless Corporation, Waterloo, Ontario (CA)

( * ) Notice: Subject to any disclaimer, the term of this patent is extended or adjusted under 35 U.S.C. 154(b) by 64 days.

(21) Appl. No.: 11/293,162

(22) Filed: Dec. 5, 2005

(65) Prior Publication Data

US 2007/0126512 A1    Jun. 7, 2007

(51) Int. Cl.
*H03L 7/00* (2006.01)
(52) U.S. Cl. .......................................... 331/17; 331/16
(58) Field of Classification Search ................. 331/17, 331/16
See application file for complete search history.

(56) References Cited

U.S. PATENT DOCUMENTS 6,281,758 B1    8/2001    Elsayed et al.
2002/0075091 A1    6/2002    Lo et al.

OTHER PUBLICATIONS

Herzel et al., An Integrated CMOS RF Synthesizer for 802.11a Wireless LAN, IEEE *Journal of Solid-State Circuits*, vol. 38, No. 10, 2003, pp. 1767-1770.
Lee et al., "A Stabilization Technique for Phase-Locked Frequency Synthesizers", *IEEE Journal of Solid-State Circuits*, vol. 38, No. 6, 2003, pp. 888-894.

*Primary Examiner*—Joseph Chang
(74) *Attorney, Agent, or Firm*—Borden Ladner Gervais LLP

(57) ABSTRACT

A phase locked loop (PLL) with reduced loop filter components having dual charge pumps and corresponding dual signal paths that reduce on-chip component size within the filters. The dual paths are combined advantageously via dual varactors within a voltage controlled oscillator to further reduce loop filter components. The PLL removes the drawbacks of noise introduced by circuitry normally used for summing dual path configurations.

19 Claims, 4 Drawing Sheets

US 7,345,550 B2

TYPE II PHASE LOCKED LOOP USING DUAL PATH AND DUAL VARACTORS TO REDUCE LOOP FILTER COMPONENTS

FIELD OF THE INVENTION

The invention relates to a phase locked loop (PLL) with reduced loop filter component values for a Type II PLL. More specifically, the present invention relates to integrated PLLs within the field of wireless communications using dual varactors within a voltage controlled oscillator (VCO) to reduce loop filter component values for the purpose of integration on an integrated circuit.

BACKGROUND OF THE INVENTION

In the field of communications, wireless (RF) communication devices such as cellular telephones and other related physical transceiver structures continue to shrink in size while adding more and more features. In conjunction with this, the required board space or "footprint" of integrated circuit (IC) elements becomes a more critical design factor. Within such RF communication devices, a local oscillator (LO) signal is required for receiving and transmitting. A conventional VCO is typically used in a PLL to generate the LO signal. In the conventional arrangement, the VCO is typically provided as a separate discrete module. Similarly, filter components (e.g., capacitors . . . etc.) have conventionally been separate due to manufacturing constraints such as size. However, this results in increased costs and required circuit board area to accommodate the VCO module and separate filter components. As such, a desirable goal has been to integrate the VCO circuitry and filter components into a single integrated circuit (IC) package with other RF circuitry so as to reduce the cost and the required circuit board area.

Within mobile phone designs, IC elements have been developed that combine PLL and VCO functions on the same semiconductor chip. By integrating the PLL and VCO functions into a single chip, the board space required is reduced over designs that use discrete PLL and VCO circuits. This opens up critically needed board space for other functions in the latest mobile handsets, allowing them to include advanced differentiating features such as an integrated camera, MP3 player, Bluetooth, or other additional features.

FIG. 1 shows a simplified block diagram of a closed-loop frequency-control system based on the phase difference between an input clock signal and a feedback clock signal of a controlled oscillator where such a system is a conventional PLL 100. The major components in such a conventional PLL 100 include a phase frequency detector (PFD), charge pump, charging capacitor 102, loop filter, VCO 101, and divider. The PFD detects the difference in phase and frequency between the reference clock $f_{ref}$ and feedback clock $f_x$ inputs and generates an "up" or "down" control signal based on whether the feedback frequency is lagging or leading the reference frequency. These "up" or "down" control signals determine whether the VCO 101 needs to operate at a higher or lower frequency, respectively. The PFD outputs these "up" and "down" signals to a charge pump. If the charge pump receives an up signal, current is driven into the loop filter. Conversely, if it receives a down signal, current is drawn from the loop filter. The loop filter converts these signals to a control voltage that is used to bias the VCO 101.

Based on the control voltage, the VCO 101 in FIG. 1 oscillates at a higher or lower frequency, which affects the phase and frequency of the feedback clock. If the PFD produces an up signal, then the VCO 101 frequency increases. A down signal decreases the VCO 101 frequency. The VCO 101 stabilizes once the reference clock $f_{ref}$ and feedback clock $f_x$ have the same phase and frequency. The loop filter filters out jitter by removing glitches from the charge pump and preventing voltage over-shoot. When the reference clock $f_{ref}$ and the feedback clock $f_x$ are aligned, the PLL is considered locked. A divider is inserted to increase the VCO 101 frequency above the input reference frequency $f_{ref}$. While Type II PLL 100 functions suitably for most applications, the loop filter components are typically large and include capacitances that must be formed off chip due to their size. This results in added expense and unsuitability for contemporary RF devices with increasingly significant size constraints.

To reduce the size of loop filter components as used in FIG. 1, other known PLL devices have been formed with dual paths. FIG. 2 shows a simplified block diagram of dual path PLL 200 with similar major components as shown in PLL 100 of FIG. 1 including a PFD, VCO 201, and divider. Operation of such is identical to that described in relation to FIG. 1. However, two charge pumps exist with respective charging capacitors 202, 203. Capacitor 203 includes a resistance 204 in parallel. While passive capacitances are shown in the form of simple capacitors 202, 203, often these are formed by active circuitry including transistors. An adder is inserted prior to the VCO 201 and within the charging paths in order to combine the outputs of the charge pumps. Because of the two paths, the charging capacitors 202, 203 can be reduced in size such that they may be small enough to place them on-chip and still provide the effective large capacitance necessary for PLL operation. Disadvantageously, the required circuitry forming the adder function introduces a significant amount of noise to the PLL 200.

What is needed therefore is a PLL that may be substantially integrated on a single chip without reliance on external circuit elements while minimizing noise.

SUMMARY OF THE INVENTION

The object of the invention is to remedy the drawbacks set out above by introducing an integrated Type II PLL using dual varactors to reduce loop filter components while reducing noise.

To this end, the invention provides a closed-loop frequency control circuit including a detector portion for detecting differences in phase and frequency between a reference phase and a feedback phase, the detector portion providing a control signal in response to the differences in phase and frequency; a first charging path for generating a first control voltage in response to the control signal; a second charging path for generating a second control voltage in response to the control signal; and a VCO generating the feedback phase and including a means for combining the first control voltage and the second control voltage. The means for combining includes two varactors within the VCO.

In another embodiment, the invention provides a method of reducing loop components within a closed-loop frequency control circuit including detecting differences in phase and frequency between a reference phase and a feedback phase via a phase frequency detector that generates a control signal in response to the differences in phase and frequency; generating a first control voltage within a first charging path in response to the control signal; generating a second control voltage within a second charging path in response to the control signal; and combining the first control voltage and the second control voltage within a VCO generating the feedback phase. Combining is performed by two varactors within the VCO.

DETAILED DESCRIPTION

The present invention improves upon the features of a PLL having a dual charge pump and related path without the drawbacks of noise introduced by circuitry for summing the dual paths. The invention will now be described with regard to an embodiment shown in FIGS. 3 and 5. While a specific embodiment is shown, it should be understood that a variety of specific circuit implementations are possible in order to form the present PLL device without straying from the intended scope of the invention.

Figure 3:
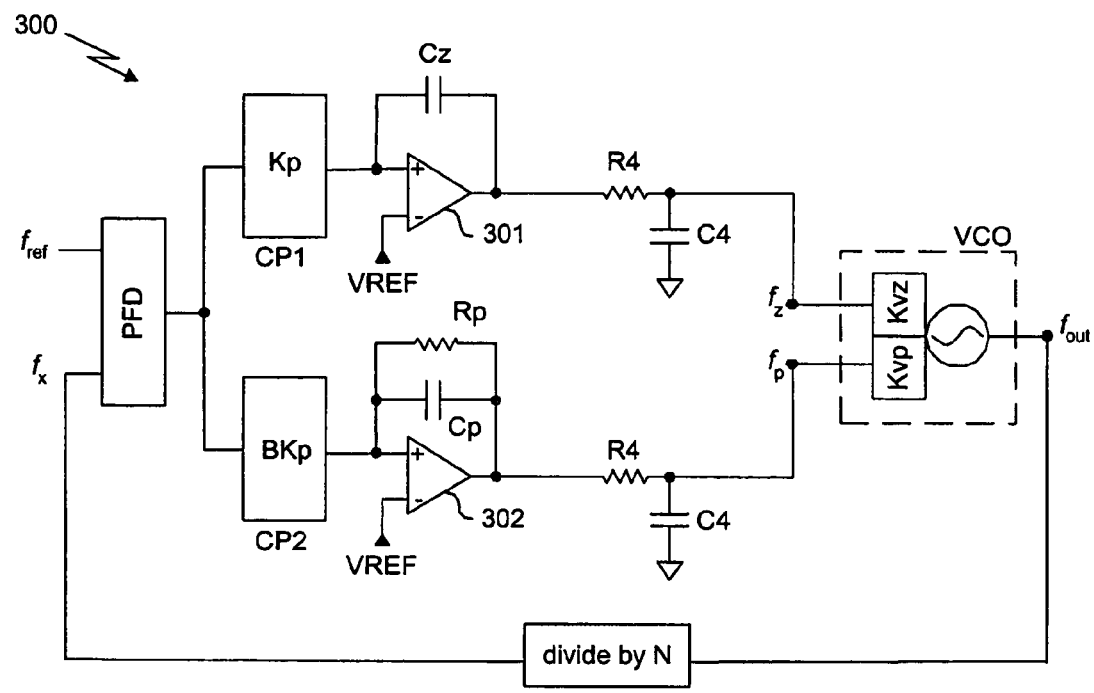
FIG. 3 is a simplified block diagram of a PLL in accordance with the present invention.

A simplified block diagram of a PLL 300 in accordance with the present invention is shown in FIG. 3. The PLL 300 includes a PFD arranged in connection with first and second charge pumps CP1, CP2. While any conventional charge pump may be used, it is desirable that CP1 and CP2 be a resistive charge pump with an integrated low noise regular and active filter. Each charge pump CP1 and CP2 are formed in a respective path. The first path as shown includes an active filter having an amplifier 301 and capacitor Cz. Similarly, the second path provides a stabilizing zero and includes an active filter having an amplifier 302 with a capacitor Cp and parallel resistor Rp. Each first and second path further include a charging capacitor C4 arranged with resistor R4 in series to ground.

The PFD of PLL 300 detects the difference in phase and frequency between the inputs for the reference clock $f_{ref}$ and the feedback clock $f_x$. The PFD then generates an "up" or "down" control signal based on whether the feedback frequency is lagging or leading the reference frequency. These "up" or "down" control signals determine whether the VCO needs to operate at a higher or lower frequency, respectively. The PFD outputs these "up" and "down" control signals to the dual charge pumps CP1, CP2. When the charge pumps CP1, CP2 receive an "up" control signal, current is driven into the respective loop filters. Conversely, current is drawn from the loop filters when a "down" control signal is received at the charge pumps CP1, CP2. The loop filters convert the control signals to a combined control voltage that is used to bias the VCO. The values of the components Cz, Cp, Rp are selected to obtain the desired loop filtering response equivalent to a Type II PLL. The components R4, C4 are used to filter out any band spurs or noise.

Each charge pump CP1, CP2 include a gain Kp. However, the charge pump CP2 includes a gain factor B. The gain factor B is selected so as to enable the size reduction of the previously off-chip (and much larger) capacitor conventionally used for filtering as discussed above. It should be understood that while the gain factor may not be too low or too high, it may be chosen from a suitable range and preferably is a gain factor of 10.

Based on this combined control voltage, the VCO oscillates at a higher or lower frequency. This affects the phase and frequency of the feedback clock. If the PFD produces an "up" control signal, then the VCO frequency $f_{out}$ increases. A "down" control signal decreases the VCO frequency $f_{out}$. The VCO stabilizes once the reference clock $f_{ref}$ and feedback clock $f_x$ have the same phase and frequency. The loop filters remove jitter of the charge pumps CP1, CP2 and prevent voltage over-shoot. When the reference clock $f_{ref}$ and the feedback clock $f_x$ are aligned, the PLL is considered locked.

Figure 5:
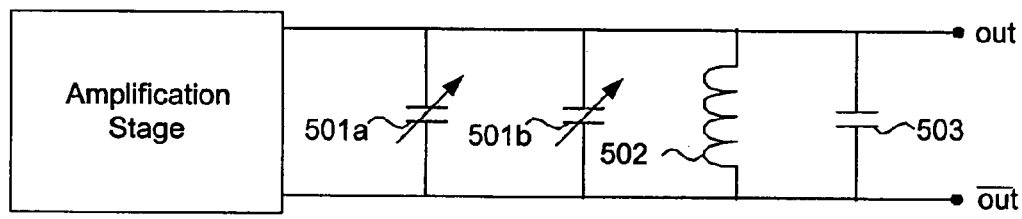
FIG. 5 is a circuit diagram of the VCO shown in FIG. 3 in accordance with the present invention.

This circuitry within each path provides a corresponding control voltage, $V_z$ and $V_p$. Unlike the prior art shown in FIG. 2, the present invention avoids additional noise penalty by combining the dual paths within the VCO. The present invention relies upon a transfer function inherent to dual varactor architecture (as shown in FIG. 5) of the VCO. The two paths are therefore combined via varactors within the VCO rather than through additional summing circuitry outside of the VCO. Accordingly, each path encounters a corresponding transfer function Kvz and Kvp that represents each varactor. In this way, the frequencies $f_z$ and $f_p$ combine to form an output frequency $f_{out}$ in accordance with the equation:

$$f_{out} = Kvz*V_z + Kvp*V_p$$

Still further, the PLL 300 includes a divide by N element that may include a digital divider operable by a digital summing module. The divider is inserted to increase the VCO frequency $f_{out}$ above the input reference frequency $f_{ref}$. Accordingly, where the VCO may output a frequency $f_{out}$ within the range of 2-4 GHz for example, the divide by N element will reduce such frequency to a typical suitable operating range of perhaps 13 MHz for example. In such instance the phase locked frequency will be determined by the equation:

$$f_{ref} = f_{out} = (Kvz*V_z + Kvp*V_p)/N, \text{ where N can be any integer or non-integer}$$

Figure 1:
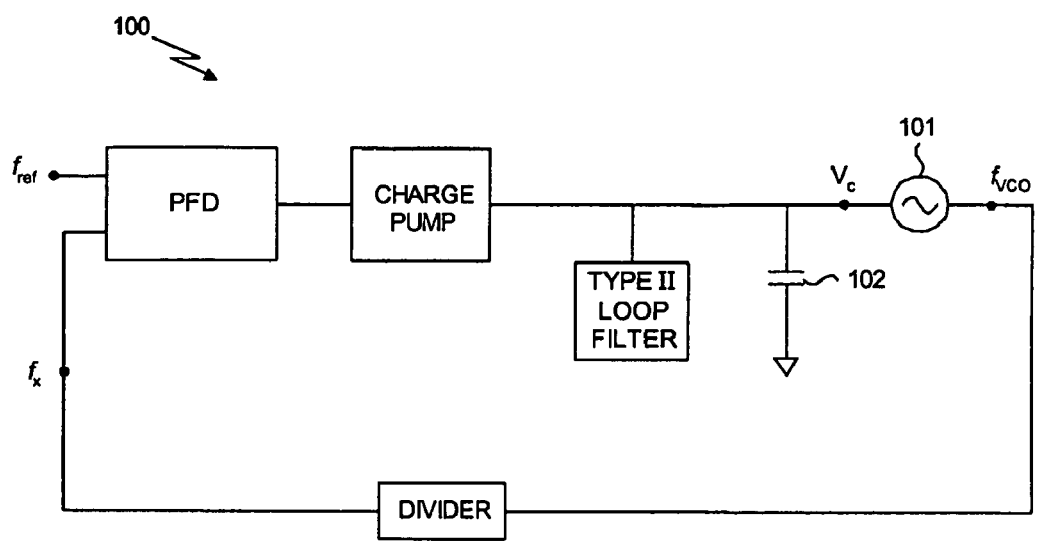
FIG. 1 is a simplified block diagram of a known PLL having a single charge pump and related path.
Figure 2:
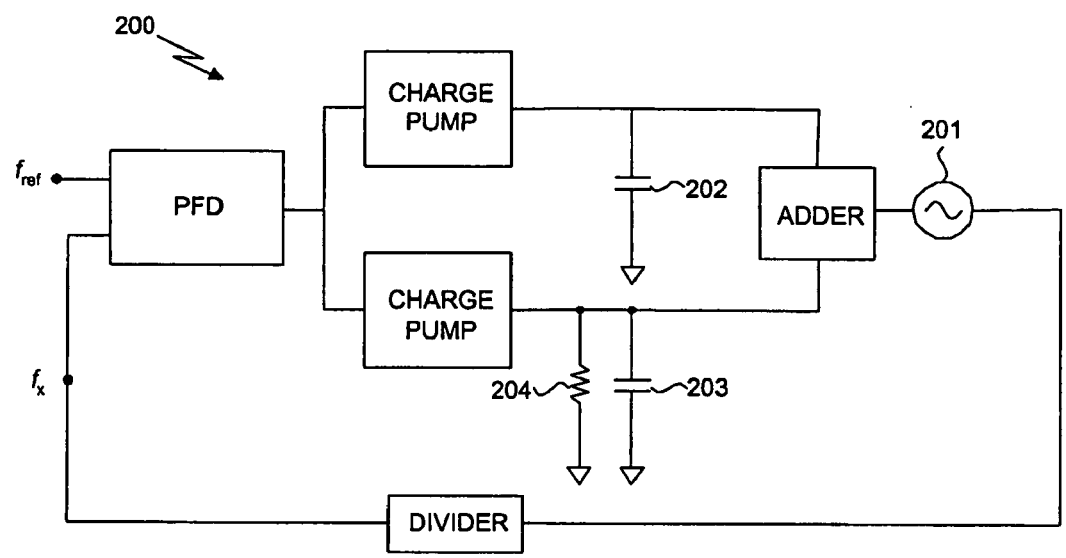
FIG. 2 is a simplified block diagram of another known PLL having a dual charge pump and related paths.
Figure 4:
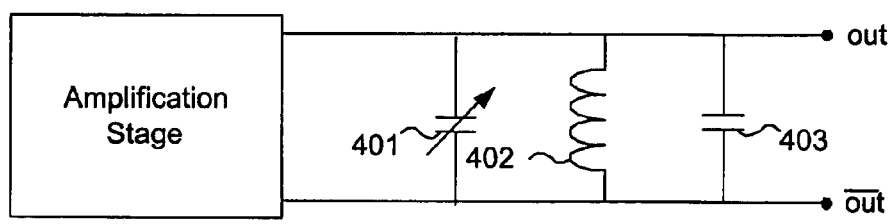
FIG. 4 is a circuit diagram of a known VCO of the type as shown FIG. 1 or 2.

FIG. 4 shows a representative circuit of a typical VCO of either FIG. 1 or FIG. 2. Such known VCO will include a typical amplification stage and a resonance stage having a single varactor 401 arranged in parallel with an inductance 402 and some digital tuning element shown as capacitance 403 to provide a differential output. In accordance with the inventive PLL 300, FIG. 5 shows a representative circuit of the VCO of FIG. 3. Here, the VCO again includes a typical amplification stage, but now includes a dual varactor arrangement within the resonance stage having varactors 501a and 501b arranged in parallel with inductance 502 along with a digital tuning element shown as capacitance 503 to provide a differential output. It should be understood that relying upon the dual varactors 501a, 501b to combine the dual paths shown in FIG. 3 allows for an overall reduction in size and number in the on-chip components used for filtering. Accordingly, the PLL 300 functions desirably within contemporary RF devices designed under increasingly significant size constraints. The varactors may be diodes, MOS devices, or any other components commonly used as varactors as known in the art.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A closed-loop frequency control circuit on a semiconductor die, said circuit comprising:
   a detector for detecting differences in phase and frequency between a reference phase and a feedback phase, said detector providing a control signal in response to said differences in phase and frequency;
   a first charging path having a first charge pump, a first active filter and a first noise filter for generating a first control voltage in response to said control signal;
   a second charging path having a second charge pump, a second active filter and a second noise filter for generating a second control voltage in response to said control signal, the first charging path and the second charging path having resistor and capacitor components formed on the semiconductor die configured for providing a type II filtering response; and
   a voltage controlled oscillator generating said feedback phase and including a means for combining said first control voltage and said second control voltage.

2. The circuit as claimed in claim 1 wherein
   said first charge pump controls current for the first active filter in response to said control signal, the first noise filter filtering noise from the first control voltage,
   said second charge pump controls current for the second active filter in response to said control sigal, the second noise filter filtering noise from the second control voltage.

3. The circuit as claimed in claim 2 wherein said means for combining said first control voltage and said second control voltage includes a transfer function element integrated within said voltage controlled oscillator.

4. The circuit as claimed in claim 3 wherein said transfer function element includes two varactors configured to receive said first and second control voltages.

5. The circuit as claimed in claim 3 wherein said transfer function element includes a first varactor receiving said first control voltage and a second varactor receiving said second control voltage.

6. The circuit as claimed in claim 4 wherein said two varactors are diodes.

7. The circuit as claimed in claim 4 wherein said first and second varactors are metal oxide semiconductor devices.

8. The circuit as claimed in claim 5 wherein said two varactors are diodes.

9. The circuit as claimed in claim 5 wherein said first and second varactors are metal oxide semiconductor devices.

10. A method of operating a voltage controlled oscillator integrated on a semiconductor die, comprising:
    detecting differences in phase and frequency between a reference phase and a feedback phase via a phase frequency detector that generates a control signal in response to said differences in phase and frequency;
    generating a first control voltage within a first charging path having resistor and capacitor components formed on the semiconductor die in response to said control signal;
    generating a second control voltage within a second charging path having resistor and capacitor components formed on the semiconductor die in response to said control signal;
    combining said first control voltage and said second control voltage within said voltage controlled oscillator for generating said feedback phase.

11. The method as claimed in claim 10 wherein
    said first charging path includes a first charge pump portion for controlling current within a first filter portion, said first charge pump portion located between said detector portion and said first filter portion,
    said second charging path includes a second charge pump portion for controlling current within a second filter portion, said second charge pump portion located between said detector portion and said first filter portion, and
    said first and second filter portions for converting said control signal into said first and second control voltages corresponding to said first and second filter portions.

12. The method as claimed in claim 10 wherein said first control voltage and said second control voltage are combined with a transfer function element integrated within said voltage controlled oscillator.

13. The method as claimed in claim 12 wherein said transfer function element includes two varactors configured to receive said first and second control voltages.

14. The method as claimed in claim 12 wherein said transfer function element includes a first varactor receiving said first control voltage and a second varactor receiving said second control voltage.

15. The method as claimed in claim 13 wherein said two varactors are diodes.

16. The method as claimed in claim 13 wherein said two varactors are metal oxide semiconductor devices.

17. The method as claimed in claim 14 wherein said first and second varactors are diodes.

18. The method as claimed in claim 14 wherein said first and second varactors are metal oxide semiconductor devices.

19. The circuit as claimed in claim 2 wherein the first charge pump has a gain of Kp and the second charge pump has a gain of Kp*B, where B gain factor being an integer value greater than 0.

* * * * *